(12) United States Patent
Hosokawa et al.

(10) Patent No.: US 8,963,192 B2
(45) Date of Patent: Feb. 24, 2015

(54) SEMICONDUCTOR LIGHT EMITTING DEVICE

(75) Inventors: Tadaaki Hosokawa, Kanagawa-ken (JP); Shuji Itonaga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/406,329

(22) Filed: Feb. 27, 2012

(65) Prior Publication Data

US 2013/0032838 A1 Feb. 7, 2013

(30) Foreign Application Priority Data

Aug. 5, 2011 (JP) ................................ P2011-171799

(51) Int. Cl.
*H01L 33/62* (2010.01)
*H01L 33/10* (2010.01)
*H01L 33/48* (2010.01)

(52) U.S. Cl.
CPC .............. *H01L 33/10* (2013.01); *H01L 33/486* (2013.01); *H01L 2224/32245* (2013.01); *H01L 2224/48091* (2013.01); *H01L 2224/48247* (2013.01); *H01L 2224/73265* (2013.01); *H01L 2224/49107* (2013.01); *H01L 2924/3025* (2013.01)
USPC .. 257/99; 257/98; 257/E33.061; 257/E33.067

(58) Field of Classification Search
CPC ..................... H01L 33/10; H01L 2224/32245; H01L 2224/48091; H01L 2224/73265; H01L 2224/48247
USPC ................. 257/79, 98, 99, E33.061, E33.067
See application file for complete search history.

(56) References Cited

U.S. PATENT DOCUMENTS

| 6,946,788 | B2 | 9/2005 | Suehiro et al. |
| 7,126,163 | B2 | 10/2006 | Katoh |
| 2005/0230699 | A1* | 10/2005 | Wu et al. ......................... 257/98 |
| 2007/0114914 | A1* | 5/2007 | Shimizu et al. ............... 313/503 |
| 2007/0194709 | A1* | 8/2007 | Kato et al. ..................... 313/512 |

FOREIGN PATENT DOCUMENTS

| JP | 2004056088 A | 2/2004 |
| JP | 2004-128445 | 4/2004 |

OTHER PUBLICATIONS

Japanese Office Action dated Feb. 26, 2014, filed in Japanese counterpart Application No. 2011-171799, 4 pages (with translation).

* cited by examiner

*Primary Examiner* — Minchul Yang
(74) *Attorney, Agent, or Firm* — Patterson & Sheridan, LLP (57) ABSTRACT

According to one embodiment, a semiconductor light emitting device having a base, a mounting material and a chip of a semiconductor light emitting element is provided. The mounting material is provided on the base. The chip of the semiconductor light emitting element is fixed onto the base via the mounting material. The chip of the semiconductor light emitting element is provided with a sapphire substrate, an active region, a light shielding portion and anode and cathode electrodes for supplying an electric power to the active region. The active region is provided on the sapphire substrate and has a light emitting layer for emitting light by supplying electric power. The light shielding portion is formed on the sapphire substrate on the side of the mounting material. The light shielding portion prevents the mounting material from being irradiated with the light produced in the light emitting layer.

16 Claims, 13 Drawing Sheets

FIG. 4A   OPTICAL IMAGE (X2,000)

FIG. 4B   SEM IMAGE (X10,000, 15° OBLIQUE)

OPTICAL IMAGE (X2,000)

FIG. 8B

SEM IMAGE (X2,000)

FIG. 11A    OPTICAL IMAGE (X2,000)

FIG. 11B    SEM IMAGE (X2,000)

CONCAVE PORTION

CONVEX PORTION

SEMICONDUCTOR LIGHT EMITTING DEVICE

CROSS-REFERENCE TO RELATED APPLICATION(S)

This application is based upon and claims the benefit of priority from the prior Japanese Patent Application No. 2011-171799, filed on Aug. 5, 2011, the entire contents of which are incorporated herein by reference.

FIELD

Embodiments described herein relate generally to a semiconductor light emitting device.

BACKGROUND

In a semiconductor light emitting device such as a light emitting diode (LED) or a laser diode, a mounting material is used to fix a chip of a semiconductor light emitting element onto a lead or a substrate. As the mounting material, an epoxy-based resin may be used.

During a long time operation of a semiconductor light emitting device, an epoxy-based resin is heated by a light emitted from a chip of a semiconductor light emitting element and the color of the epoxy-based resin changes. The color change decreases reflection of light from the epoxy-base resin and decreases brightness. As a result, reliability of the semiconductor light emitting device is lowered.

As to a blue LED which generates light having a short wavelength and a high energy, the color change in an epoxy-based resin is accelerated, as compared with the other LEDs.

DETAILED DESCRIPTION

According to one embodiment, a semiconductor light emitting device having a base, a mounting material and a chip of a semiconductor light emitting element is provided. The mounting material is provided on the base. The chip of the semiconductor light emitting element is fixed onto the base via the mounting material. The chip of the semiconductor light emitting element is provided with a sapphire substrate, an active region, a light shielding portion and anode and cathode electrodes for supplying an electric power to the active region.

The active region is provided on the sapphire substrate and has a light emitting layer for emitting light by supplying an electric power. The light shielding portion is formed on the sapphire substrate on the side of the mounting material. The light shielding portion prevents the mounting material from being irradiated with the light produced in the light emitting layer.

Hereinafter, further embodiments will be described with reference to the drawings. In the drawings, the same reference numerals denote the same or similar portions respectively.

A first embodiment will be described with reference to FIGS. 1 and 2.

Figure 1:
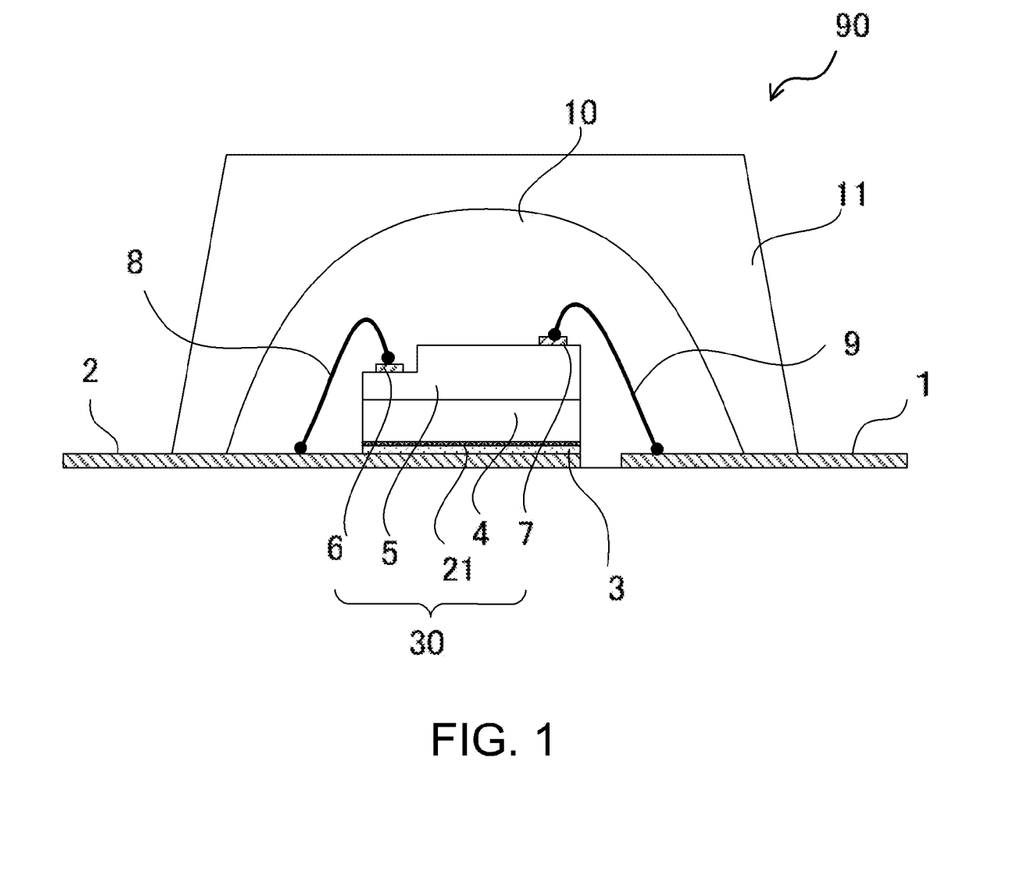
FIG. 1 is a schematic cross-sectional view illustrating a semiconductor light emitting device according to a first embodiment.

FIG. 1 is a schematic cross-sectional view illustrating a semiconductor light emitting device according to a first embodiment. FIG. 2 is a diagram illustrating light emissions and light advancing directions in a chip of a semiconductor light emitting element of the semiconductor light emitting device. In the embodiment, a light shielding layer is provided on a side of a back surface of a sapphire substrate, and a light produced by a light emitting layer of the semiconductor light emitting element is shielded by the light shielding layer to suppress deterioration of a mounting material due to light incidence.

As illustrated in FIG. 1, a semiconductor light emitting device 90 is provided with leads 1, 2, a mounting material 3, a chip 30 of a semiconductor light emitting element, bonding wires 8 and 9, a fluorescent material 10, and a sealing material 11. The semiconductor light emitting device 90 is a sealed GaN-based blue light emitting diode.

On the lead 2, the mounting material 3 and the chip 30 of the semiconductor light emitting element are stacked alternately. The mounting material 3 fixes the chip 30 of the semiconductor light emitting element onto the lead 2. For the mounting material 3, an epoxy-based resin is used for example.

The chip 30 of the semiconductor light emitting element includes a light shielding layer 21 that is a light shielding portion, a sapphire substrate 4, an active region 5, a cathode electrode (n electrode) 6, and an anode electrode (p electrode) 7.

The light shielding layer 21 is provided between the mounting material 3 and the sapphire substrate 4. The sapphire substrate 4 is provided between the light shielding layer 21 and the active region 5. The light shielding layer 21 is a layer which is obtained by reforming a portion of the sapphire substrate 4 to become noncrystalline aluminum oxide ($Al_xO_y$). As illustrated in FIG. 2, the active region 5 includes plural epitaxial layers 22a, 22, and 22b which are formed on the substrate 4 using an epitaxial growth method. The epitaxial layer 22a is an n-type GaN semiconductor layer. The epitaxial layer 22 is an InGaN quantum well light emitting layer. The epitaxial layer 22b is a semiconductor layer which is obtained by stacking a p-type AlGaN layer 22c and a p-type GaN layer 22d. The epitaxial layer 22 is a semiconductor layer which is obtained by stacking plural InGaN quantum well layers and plural InGaN barrier layers alternately.

On a concave portion of a peripheral portion of the active region 5, the cathode electrode 6 is provided. The cathode electrode 6 is connected to the lead 2 through the bonding wire 8. On an upper portion of the active region 5, the anode electrode 7 is provided. The anode electrode 7 is connected to the lead 1 through the bonding wire 9.

The fluorescent material 10 is formed on the leads 1 and 2 to cover the mounting material 3, the chip 30 of the semiconductor light emitting element, and the bonding wires 8 and 9. The sealing material 11 is formed on the leads 1 and 2 to seal the mounting material 3, the chip 30 of the semiconductor light emitting element, the bonding wires 8 and 9, and the fluorescent material 10.

The embodiment can be applied to LEDs of a seamless multi-screen device (SMD) type, a chip-on-board (COB) type, and a face-up (FU) type.

Figure 2:
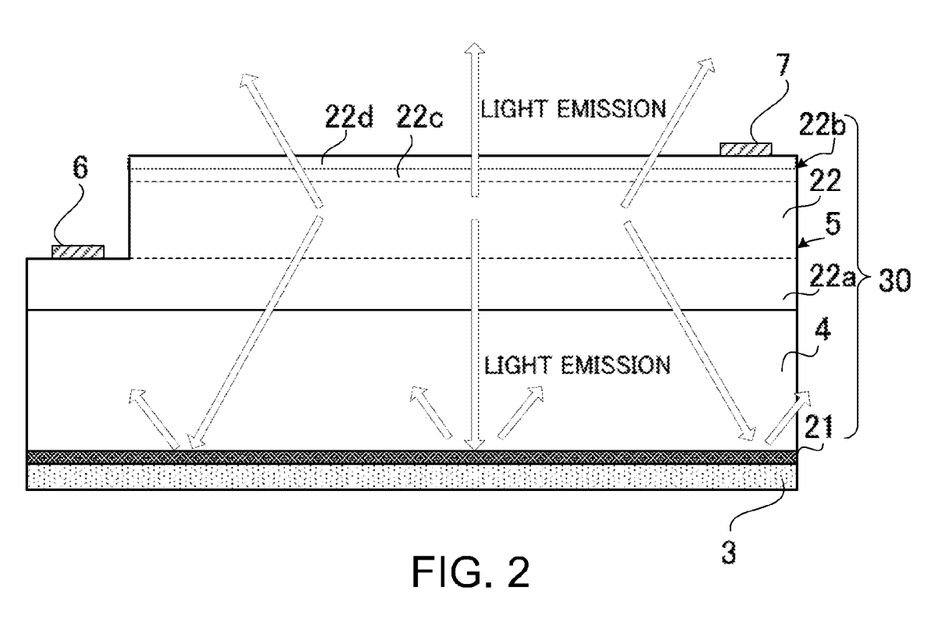
FIG. 2 is a diagram illustrating light emissions and light advancing directions in a chip of a semiconductor light emitting element of the semiconductor light emitting device.

As illustrated in FIG. 2, in the semiconductor light emitting element 30, when a current flows between the cathode electrode 6 and the anode electrode 7, the light emitting layer 22 that is one of the epitaxial layers provided in the active region 5 emits lights and the lights are radiated in a thickness direction of the substrate 4 i.e., a vertical direction in FIG. 2. One of the lights that advances in a downward direction in FIG. 2 is reflected by the light shielding layer 21 is not transmitted through the mounting material 3 provided on a side of a back surface of the substrate 4, and is prevented from reaching the mounting material 3.

Therefore, even after the semiconductor light emitting device 90 is operated for a long time, a color change of the mounting material 3 may not be caused by heating with the light and a color change may not be caused due to deterioration by light incidence. Since the light shielding layer 21 is a reformation layer of the sapphire substrate 4, the configuration of the semiconductor light emitting device 90 is not complicated and ensures matching with the mounting material 3. In a case where the light shielding layer 21 is not provided, when the color of the mounting material 3 changes, the light can not be reflected. For this reason, reflection of the light from the mounting material 3 decreases so that brightness decreases.

Figure 3:
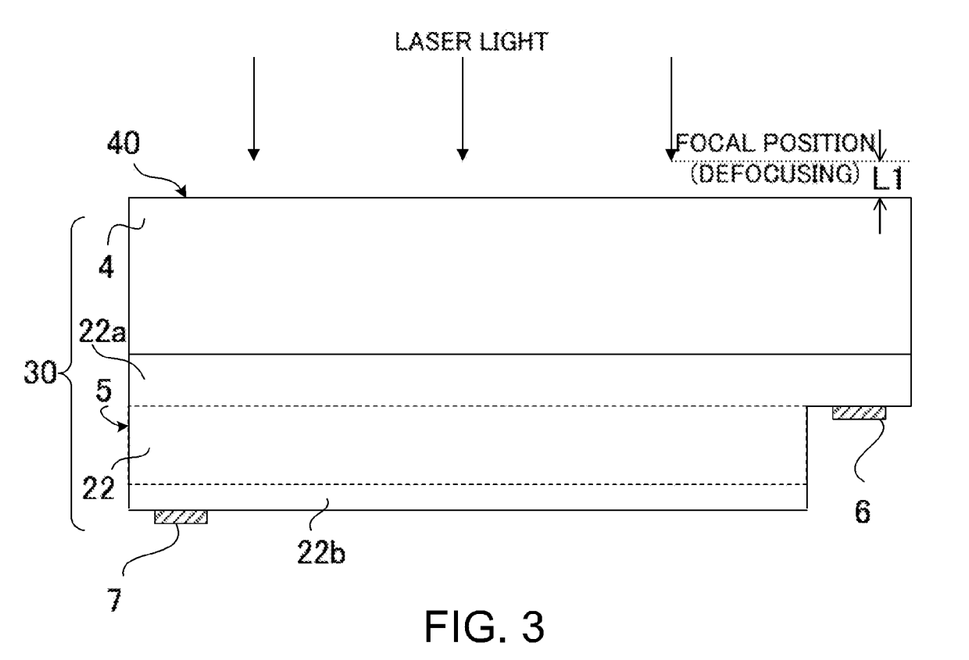
FIG. 3 is a diagram illustrating a method of forming a light shielding layer in the chip of the semiconductor light emitting element.
Figure 4A:
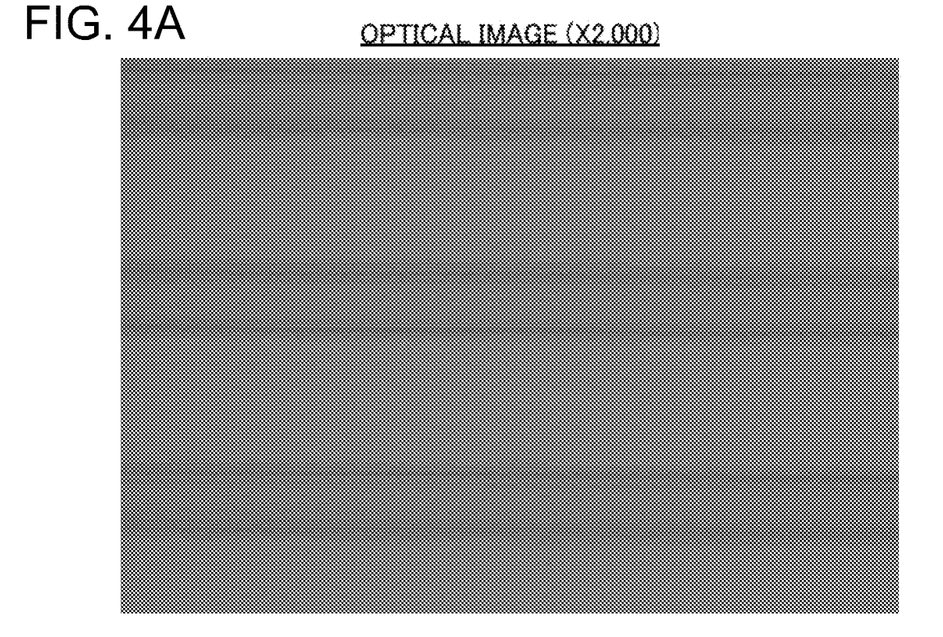
FIG. 4A is a diagram illustrating an optical image of the light shielding layer.
Figure 4B:
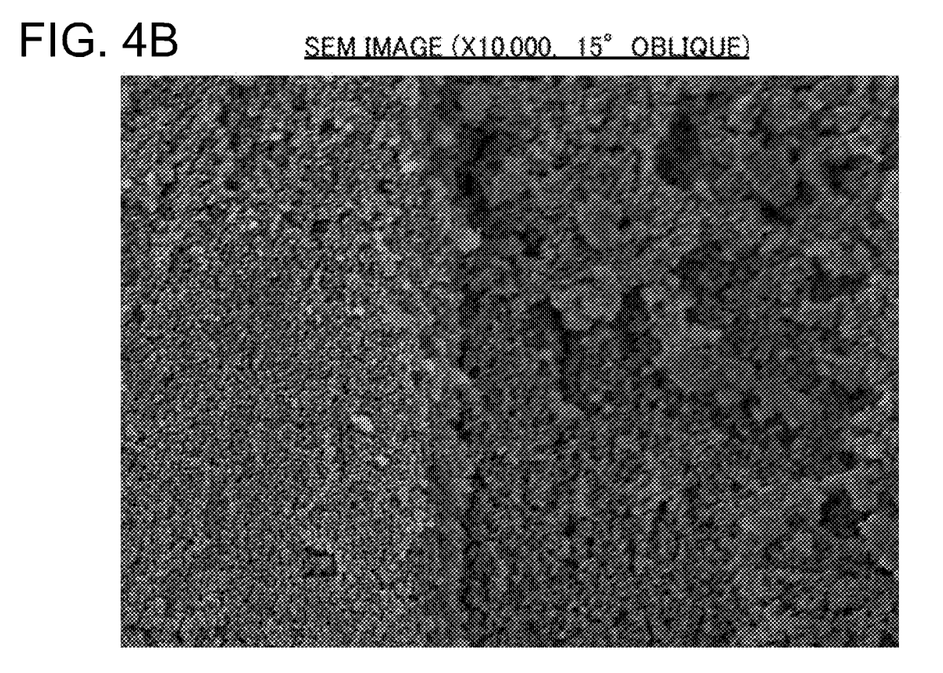
FIG. 4B is a diagram illustrating an SEM image of the light shielding layer.

A method of forming a light shielding layer will be described with reference to FIGS. 3 and 4. FIG. 3 is a diagram illustrating a method of forming the light shielding layer. FIG. 4A is a diagram illustrating an optical image of the light shielding layer, and FIG. 4B is a diagram illustrating an SEM image of the light shielding layer. In an example illustrated in FIG. 3, a laser light is radiated from a side of a back surface of a wafer where plural semiconductor light emitting elements are formed. In FIG. 3, only representative one of the semiconductor light emitting elements is illustrated.

According to the method illustrated in FIG. 3, the laser light is radiated from the side of the back surface of the sapphire substrate 4 so that the light shielding layer 21 is formed on the back surface of the substrate 4.

Example radiation conditions of the laser light to be radiated in the method are following. A single pulse light is used. The wavelength ($\lambda$) of the single pulse light is 355 nm, the power of the single pulse light is 40 to 200 mW, and the radiation time of the single pulse light is nanoseconds. The focusing position is set to a position which is distant from the side of the back surface of the substrate 4 by a distance L1, and defocusing is performed. The distance L1 is desirably set to several tens µm. By the laser light radiation, a portion of the sapphire substrate 4 is reformed to become noncrystalline aluminum oxide ($Al_xO_y$) and the light shielding layer 21 is obtained. In this process, when the reformation is further advanced, disconnection of oxygen increases and the aluminum oxide ($Al_xO_y$) becomes a group of aluminum particles having a small size.

In a case where the laser light is not radiated, when the active region 5 is seen from the sapphire substrate 4 using an optical microscope, patterns such as the electrodes formed on the active region 5 can be clearly observed since a sapphire transmits light.

When the active region 5 is seen from the side of the light shielding layer 21 using an optical microscope with a high magnification (×2,000), the light is reflected by the light shielding layer 21 of noncrystalline aluminum oxide ($Al_xO_y$) so that, as illustrated in FIG. 4A, the patterns that are formed on the active region 5 become unclear.

When a surface of the light shielding layer 21 is seen from an angle of 15° using a scanning electron microscope (SEM) with a high magnification (×10,000), as illustrated in FIG. 4B, it can be found that a sapphire was melted once by the laser light, that a crystalline property was lost, and that noncrystalline aluminum oxide ($Al_xO_y$) particles of a minute size were formed. The sizes and the heights of the noncrystalline aluminum oxide ($Al_xO_y$) particles are not uniform and do not have periodicity.

Figure 5:
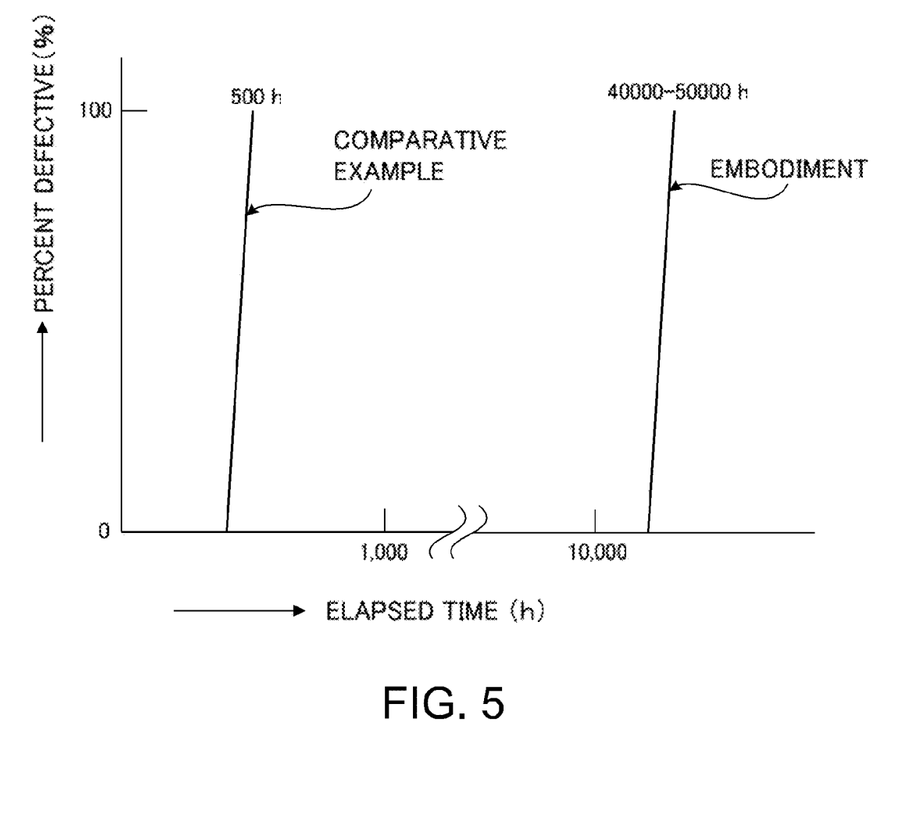
FIG. 5 is a diagram illustrating a relation between an elapsed time and a percent defective as a result of a reliability test of the semiconductor light emitting device according to the first embodiment.

The reliability of the semiconductor light emitting device according to the embodiment will be described with reference to FIG. 5. FIG. 5 is a diagram illustrating a relation between an elapsed time and a percent defective as a result of a reliability test of the semiconductor light emitting device according to the first embodiment, comparing with a comparative example. In the reliability test, a 70% lumen maintenance factor of a case where an electric power is continuously supplied is used as a determination reference of brightness deterioration.

The structure of the comparative example is the same as the structure of the first embodiment, except that a light shielding layer is not provided on a back surface of a sapphire substrate. In a semiconductor light emitting device according to the comparative example, a color of a mounting material which fixes the sapphire substrate onto a lead changes by influence of overheating with a light radiated from a light emitting layer of a semiconductor light emitting element, or by the light radiation. As a result, reflection of the light from the mounting material decreases, and brightness decreases. As illustrated in FIG. 5, it is found that the reliability becomes poor at an elapsed time of 500 hours.

In the semiconductor light emitting device 90 according to the embodiment, since the light shielding layer 21 is provided on the back surface of the substrate 4, the light produced by the light emitting layer 22 of the chip 30 of the semiconductor light emitting element is reflected by the light shielding layer 21 and does not reach the mounting material 3. As a result, the mounting material 3 is not deteriorated by the light and the decrease in brightness is suppressed. In addition, it is found that the reliability does not become poor at elapsed time of 40,000 to 50,000 hours.

As described above, in the semiconductor light emitting device according to the embodiment, the chip 30 of the semiconductor light emitting element includes the light shielding layer 21, the sapphire substrate 4, the active region 5, the cathode region 6, and the anode electrode 7. The light shielding layer 21 is provided between the mounting material 3 and the substrate 4. The light shielding layer 21 is a layer which is obtained by reforming a portion of the sapphire substrate 4 to become the noncrystalline aluminum oxide ($Al_xO_y$). The light shielding layer 21 reflects the light which is emitted from the light emitting layer 22 of the active region 5 and prevents the light from being incident on the mounting material 3 provided on the side of the back surface of the substrate 4.

The color change of the mounting material 3 may not be caused due to the light emitted from the light emitting layer 22. Thus, decrease in brightness can be suppressed and the reliability of the semiconductor light emitting device 90 can be improved.

In the embodiment, the GaN-based blue light emitting diode is used as the semiconductor light emitting element. However, the type of the semiconductor light emitting element invention is not limited to the light emitting diode. For example, an AlGaInP-based light emitting diode, an AlGaAs-based light emitting diode, a GaP-based light emitting diode, or a GaAsP-based light emitting diode may be used.

The radiation conditions of the laser light are not necessarily limited to the conditions described in the embodiment. For example, instead of radiating the laser light of the single pulse, radiation of a laser light of a double pulse may be used. Instead of radiating the pulse light where the irradiation time is nanoseconds, radiation of a pulse light where the irradiation time is picoseconds or radiation of a pulse light where the irradiation time is picoseconds may be used. Instead of the laser light having the wavelength ($\lambda$) of 355 nm, a laser light having a wavelength of 700 to 800 nm may be used.

A semiconductor light emitting device according to a second embodiment will be described with reference to the drawings.

Figure 6:
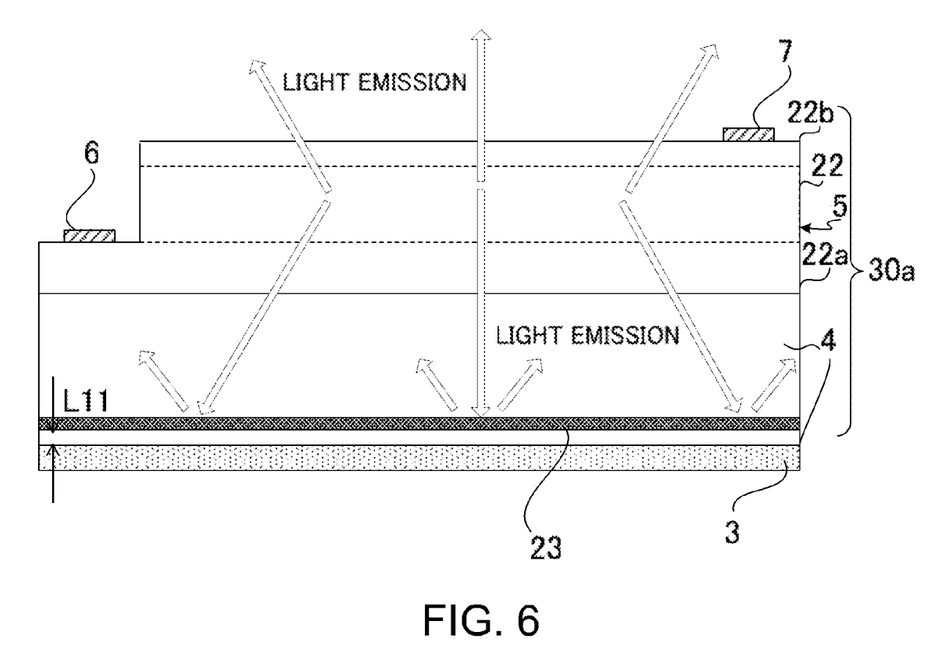
FIG. 6 is a diagram illustrating light emissions and light advancing directions in a chip of a semiconductor light emitting element of a semiconductor light emitting device according to a second embodiment.

FIG. 6 is a diagram illustrating light emissions and light advancing directions in a chip of a semiconductor light emitting element of the semiconductor light emitting device according to the second embodiment. In the embodiment, a light shielding layer is provided within a sapphire substrate to suppress a mounting material from being deteriorated due to light incidence.

The semiconductor light emitting device according to the embodiment uses a sealed GaN-based blue light emitting diode.

As illustrated in FIG. 6, in a chip 30a of a semiconductor light emitting element which is used in the semiconductor light emitting device according to the embodiment, a light shielding layer 23 that is a light shielding portion is provided in a sapphire substrate 4 with a distance L11 from a back surface of the substrate 4. The semiconductor light emitting device according to the embodiment has the same configuration as that of the semiconductor light emitting device 90 according to the first embodiment, except for the formation position of the light shielding layer.

In the semiconductor light emitting device according to the embodiment, an electric power is supplied between a cathode electrode 6 and an anode electrode 7, and current flows through an active region 5. By the current, a light emitting layer 22 which is provided in the active region 5 emits light and a light is produced to radiate in a thickness direction of the substrate 4 i.e. a vertical direction in the FIG. 6. The light which advances in a downward direction in FIG. 6 is reflected by the light shielding layer 23 and does not reach a portion of the substrate 4 below the light shielding layer 23 and the mounting material 3. Accordingly, even after the semiconductor light emitting device is operated for a long time, the color change of the mounting material 3 is not caused by heating with the light and the color change of the mounting material 3 is not caused by deterioration due to light incidence. Since the light shielding layer 23 is a reformation layer provided within the sapphire substrate 4, the configuration of the semiconductor light emitting device 90 is not complicated and matching of the sapphire substrate 4 with the mounting material 3 and the active region 5 is maintained.

Figure 7:
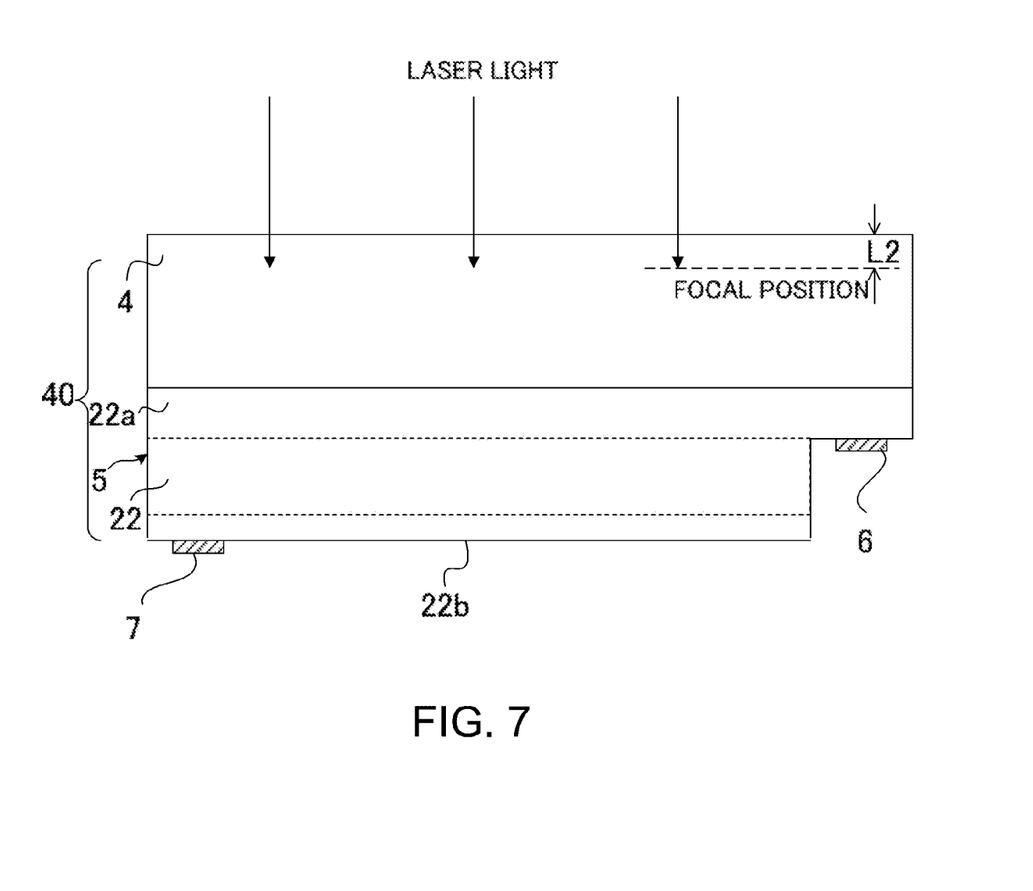
FIG. 7 is a diagram illustrating a method of forming a light shielding layer in the chip of the semiconductor light emitting element of the semiconductor light emitting device according to the second embodiment.
Figure 8A:
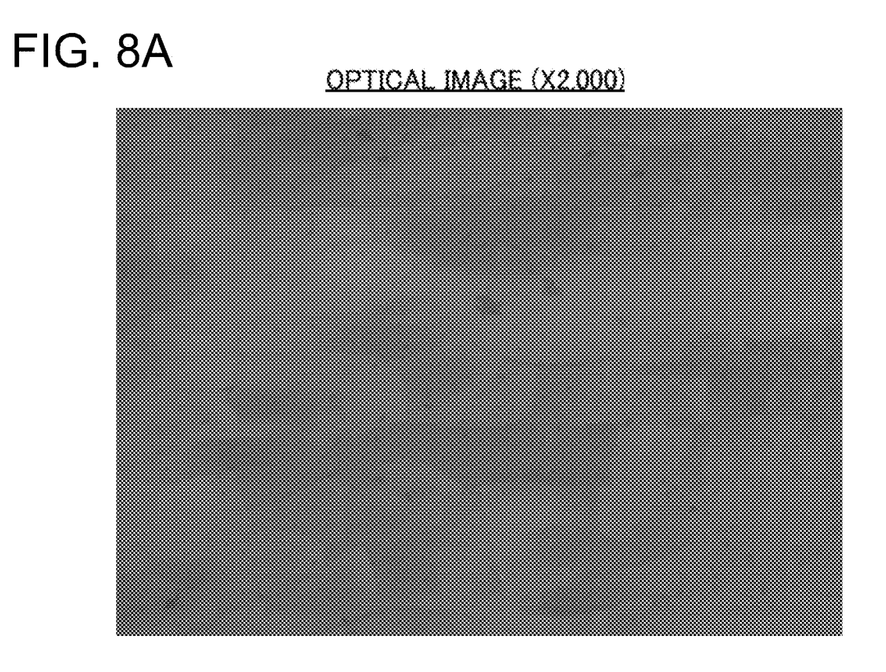
FIG. 8A is a diagram illustrating an optical image of the light shielding layer provided in the second embodiment.
Figure 8B:
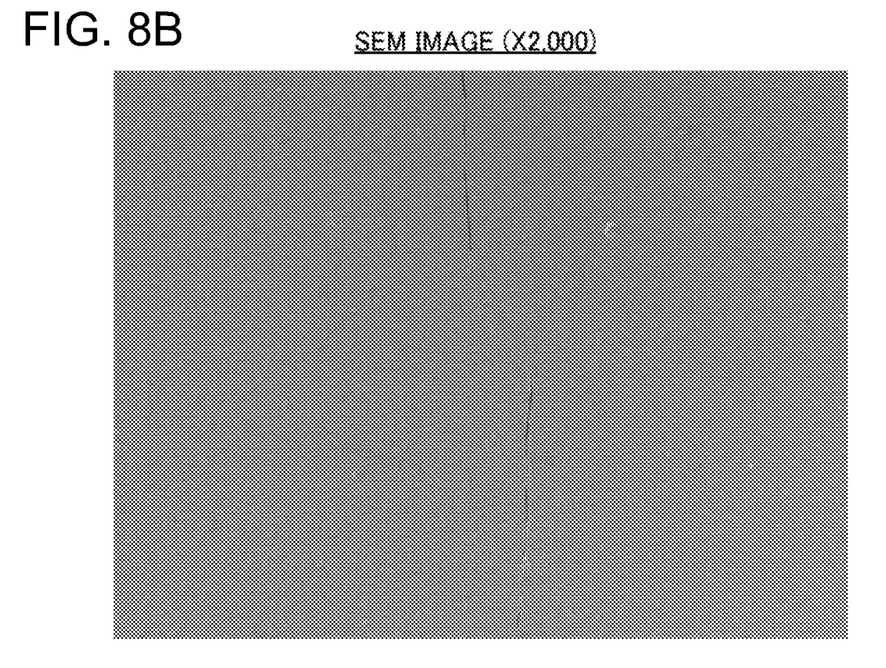
FIG. 8B is a diagram illustrating an SEM image of the light shielding layer provided in the second embodiment.

A method of forming the light shielding layer 23 according to the embodiment will be described with reference to FIGS. 7, 8A and 8B. FIG. 7 is a diagram illustrating a method of forming a light shielding layer. FIG. 8A is a diagram illustrating an optical image of a formed light shielding layer and FIG. 8B is a diagram illustrating an SEM image of the formed light shielding layer. In the method of forming the light shielding layer, a laser light is radiated from a side of a back surface of a wafer where plural semiconductor light emitting elements are formed. In FIG. 7, only representative one of the semiconductor light emitting elements is illustrated.

As illustrated in FIG. 7, a laser light is radiated from a side of a back surface of a sapphire substrate 4 and a light shielding layer 23 is formed in the substrate 4.

Example radiation conditions of the laser light are following. A single pulse light is used. The wavelength ($\lambda$) of the single pulse light is 355 nm. The power of the single pulse light is 40 to 50 mW. The irradiation time of the single pulse light is nanoseconds. The focusing position is set to a position which is distant from the side of the back surface of the substrate 4 by a distance L2. The distance L2 is desirably set to be within a range shown by the following expression.

$$10\ \mu m < L2 < 30\ \mu m \quad (1)$$

With radiation of the laser light, a part of an inner portion of the sapphire substrate 4 is reformed and the light shielding layer 23 of noncrystalline aluminum oxide is formed within the substrate 4.

When the active region 5 is seen from the back surface of the substrate 4 using an optical microscope with a high magnification (×2,000), as illustrated in FIG. 8A, a surface pattern which is formed on the active region 5 is not observed since a light is reflected by the light shielding layer 23 of the noncrystalline aluminum oxide formed in the substrate 4.

When the back surface of the substrate 4 is seen using a SEM with a high magnification (×2,000), as illustrated in FIG. 8B, the SEM image becomes unclear since the light shielding layer 23 is observed through a portion of the substrate 4 having a thickness corresponding to the distance L2.

As described above, in the semiconductor light emitting device according to the embodiment, the chip 30a of the semiconductor light emitting element includes the light shielding layer 23 in addition to the sapphire substrate 4, the active region 5, the cathode electrode 6 and the anode electrode 7. The light shielding layer 23 is provided in the substrate 4 at a position which is distant from the back surface of the substrate 4 by the distance L11. The light shielding layer 23 is a noncrystalline layer which is obtained by reforming a portion of the sapphire substrate 4. The light shielding layer 23 reflects the light radiated from the light emitting layer 22 and prevents the light from being incident on the mounting material 3 provided on the side of the back surface of the substrate 4.

The color change of the mounting material 3 is not caused by the light emitted from the light emitting layer 22. Accordingly, decrease in brightness which is caused by decrease of reflection of a light from the mounting material can be suppressed and the reliability of the semiconductor light emitting device can be improved.

A semiconductor light emitting device according to a third embodiment of the invention will be described with reference to FIG. 9.

Figure 9:
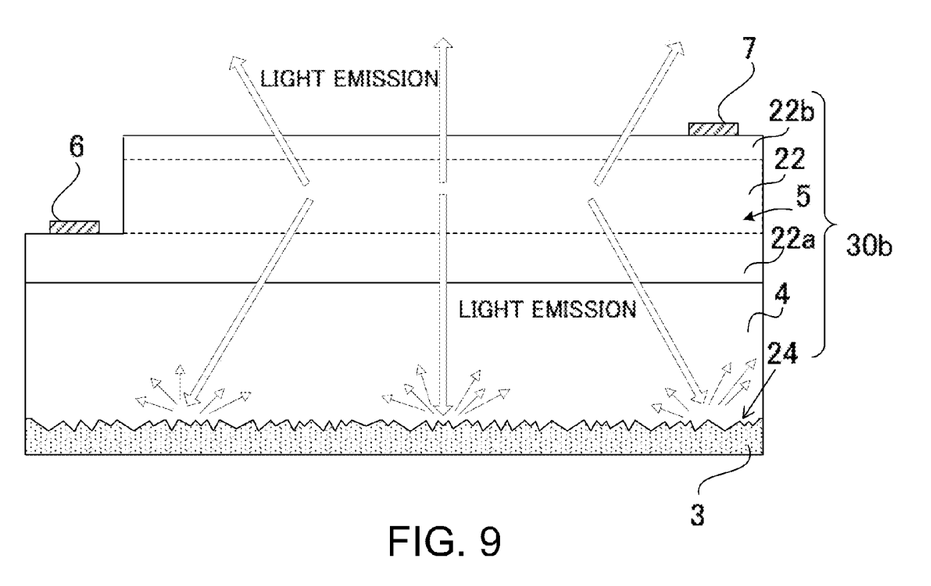
FIG. 9 is a diagram illustrating light emissions and light advancing directions in a chip of a semiconductor light emitting element of a semiconductor light emitting device according to a third embodiment.

FIG. 9 is a diagram illustrating light emissions and light advancing directions in a chip of a semiconductor light emitting element of the semiconductor light emitting device according to the third embodiment. In the embodiment, an uneven portion is provided, as a light shielding layer, on a side of a back surface of a sapphire substrate to suppress a mounting material from being deteriorated by light incidence.

The semiconductor light emitting device according to the embodiment uses a sealed GaN-based blue light emitting diode.

As illustrated in FIG. 9, in a chip 30b of a semiconductor light emitting element which is used in the semiconductor light emitting device according to the embodiment, an uneven portion 24 is provided on a back surface of a sapphire substrate 4. The semiconductor light emitting device according to the embodiment has the same configuration as that of the semiconductor light emitting device 90 according to the first embodiment, except that the uneven portion 24 is provided as the light shielding portion instead of the light shielding layer 21.

The uneven portion 24 is formed to contact a mounting material 3 and has irregular convex and concave shapes and heights and non-periodicity. The uneven portion 24 is formed with a laser light radiated from the side of the back surface of the substrate 4.

In the semiconductor light emitting device according to the embodiment, an electric power is supplied between a cathode electrode 6 and an anode electrode 7 and current flows through an active region 5. By the current, a light emitting layer 22 which is provided in the active region 5 emits light and the emitted light is radiated in a thickness direction of the substrate 4, i.e., a vertical direction in FIG. 9. The emitted light which advances in a downward direction in FIG. 9 is scattered by the uneven portion 24, is reflected at a surface of the mounting material 3, and does not reach an inner portion of the mounting material 3. Thus, even after the semiconductor light emitting device is operated for a long time, a color change of the mounting material 3 is not caused by the radiated light.

Since the radiated light is shielded by the uneven portion 24 provided in the sapphire substrate 4, the configuration of the semiconductor light emitting device 90 is not complicated and ensures matching of the sapphire substrate 4 with the mounting material 3.

Figure 10:
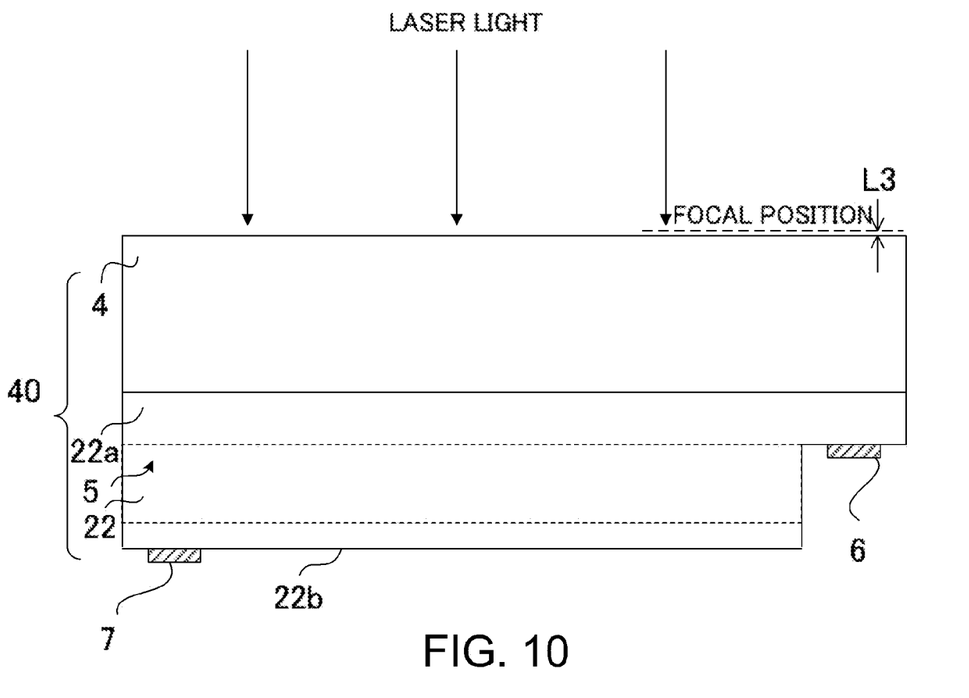
FIG. 10 is a diagram illustrating a method of forming an uneven portion in the chip of the semiconductor light emitting element of the semiconductor light emitting device according to the third embodiment.
Figure 11A:
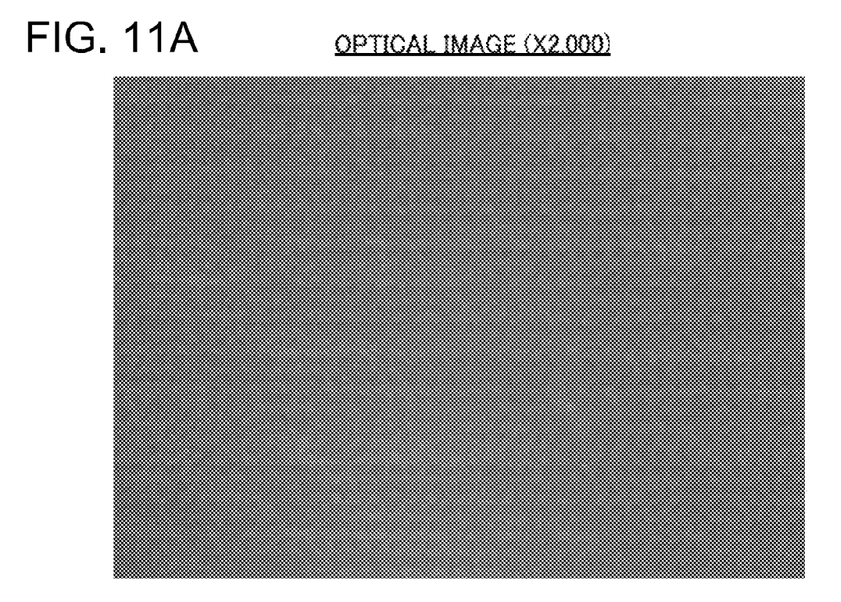
FIG. 11A is a diagram illustrating an optical image of the uneven portion provided in the third embodiment.
Figure 11B:
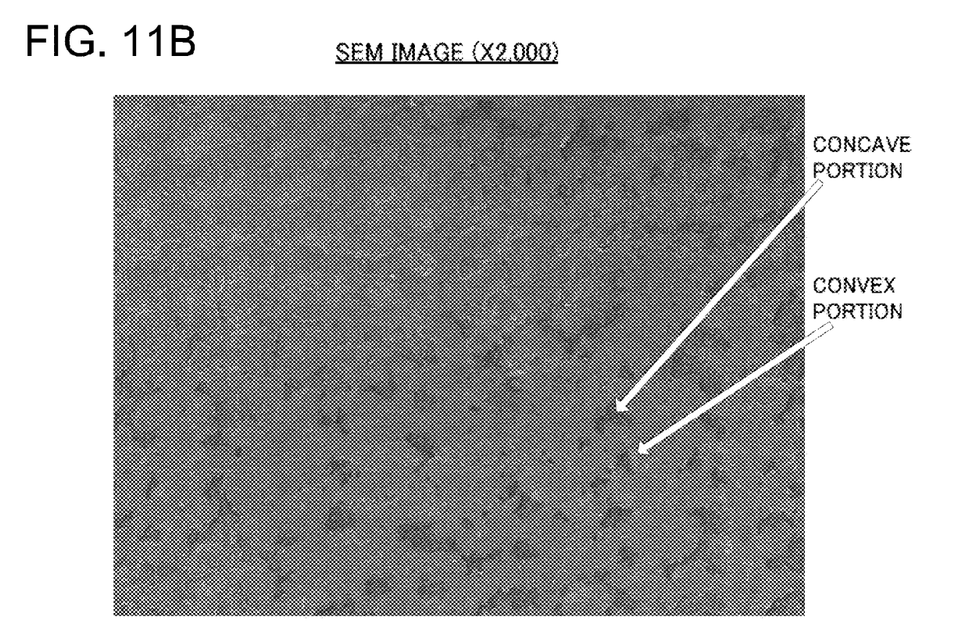
FIG. 11B is a diagram illustrating an SEM image of the uneven portion provided in the third embodiment.

A method of forming the uneven portion 24 will be described with reference to FIGS. 10 and 11A and 11B. FIG. 10 is a diagram illustrating a method of forming an uneven portion in a substrate. FIG. 11A is a diagram illustrating an optical image of a formed uneven portion, and FIG. 11B is a diagram illustrating an SEM image of the formed uneven portion. In the method of forming the uneven portion, laser light is radiated from a side of a back surface of a wafer where plural semiconductor light emitting elements are formed. In FIG. 10, only representative one of the semiconductor light emitting elements is illustrated.

As illustrated in FIG. 10, the laser light is radiated from a side of a back surface of the sapphire substrate 4 and the uneven portion 24 is formed on the side of the back surface of the substrate 4.

Example radiation conditions of the laser light are following. A single pulse light is employed. The wavelength (λ) of the single pulse light is 355 nm. The power of the single pulse light is 40 to 200 mW. The radiation time of the single pulse light is nanoseconds. The focusing position is set to a position which is distant from the back surface of the substrate 4 by a distance L3. The distance L3 is desirably set to be within a range shown by the following expression.

$$-10\ \mu m < L3 < 10\ \mu m \qquad (2)$$

Accordingly, the focusing position is set to a position near the back surface of the substrate 4. With radiation of the laser light, the sapphire substrate 4 is melted once and recrystallized so that an uneven portion 24 is formed on the back surface of the substrate 4.

When the active region 5 is seen from the side of the back surface of the substrate 4 using a microscope with a high magnification (×2,000), as illustrated in FIG. 11A, a surface pattern which is formed on the active region 5 is not observed since incident light is scattered at the uneven portion 24 formed on the back surface of the substrate 4.

When the back surface of the substrate 4 is seen using an SEM with a high magnification (×2,000), as illustrated in FIG. 11B, it is found that convex and concave portions having different sizes and depths was irregularly formed on the back surface of the substrate 4.

As described above, in the semiconductor light emitting device according to the embodiment, the chip 30b of the semiconductor light emitting element includes the uneven portion 24 in addition to the sapphire substrate 4, the active region 5, the cathode electrode 6, and the anode electrode 7. The uneven portion 24 is provided on the side of the back surface of the substrate 4, and the sizes and depths of the convex and concave portions are irregular. The uneven portion 24 is obtained by melting the sapphire substrate 4 once and by recrystallizing the substrate. The uneven portion 24 scatters the light which is emitted from the light emitting layer 22, and prevents the emitted light from being incident on the mounting material 3 provided on the side of the back surface of the substrate 4.

The color change of the mounting material 3 is not caused by the light emitted from the light emitting layer 22. Thus, decrease in brightness which is caused due to decrease of reflection of the light from the mounting material can be suppressed, and the reliability of the semiconductor light emitting device can be improved.

Figure 12:
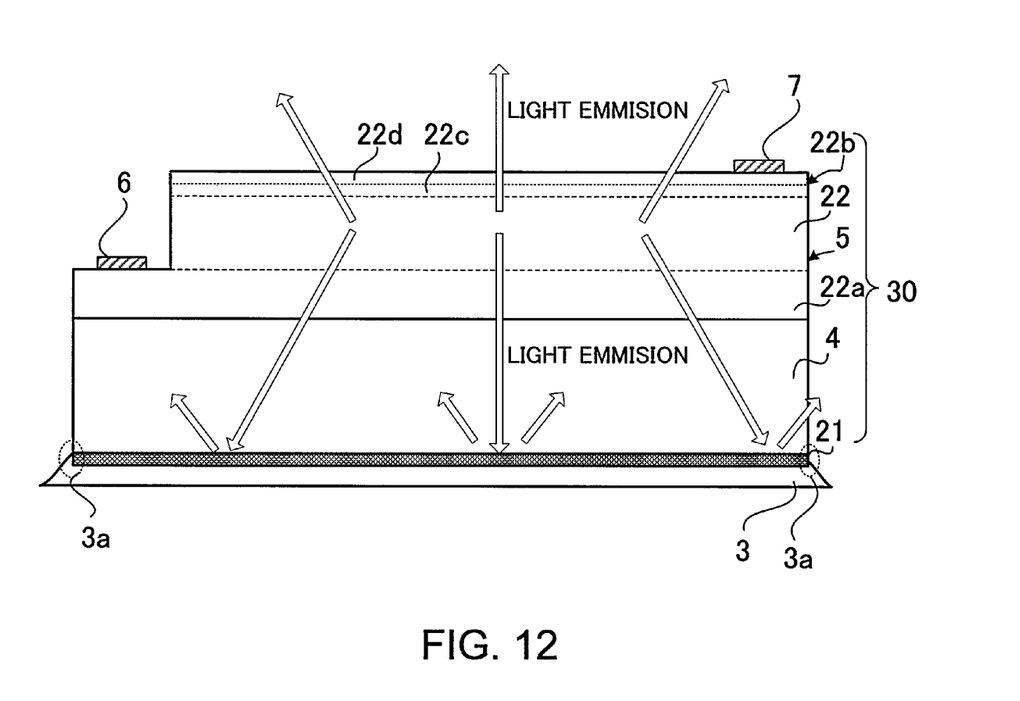
FIG. 12 is a schematic cross-sectional view illustrating a case where a mounting material is formed so as to creep up along a side surface of a sapphire substrate in the first embodiment.

FIG. 12 shows a case where a mounting material 3 is formed so as to creep up along a side surface of a substrate 4 of sapphire in the first embodiment. In a case where the height of a portion 3a of the mounting material 3 that creeps up is within several μm, the upper portion of the reformed layer of aluminum oxide ($Al_xO_y$) that is the light shielding layer 21 obtained by reforming a portion of the sapphire substrate 4 is formed at a position higher than the upper portion of the creeping portion 3a so that deterioration of the creeping portion 3a of the mounting material 3 is effectively prevented.

Figure 13:
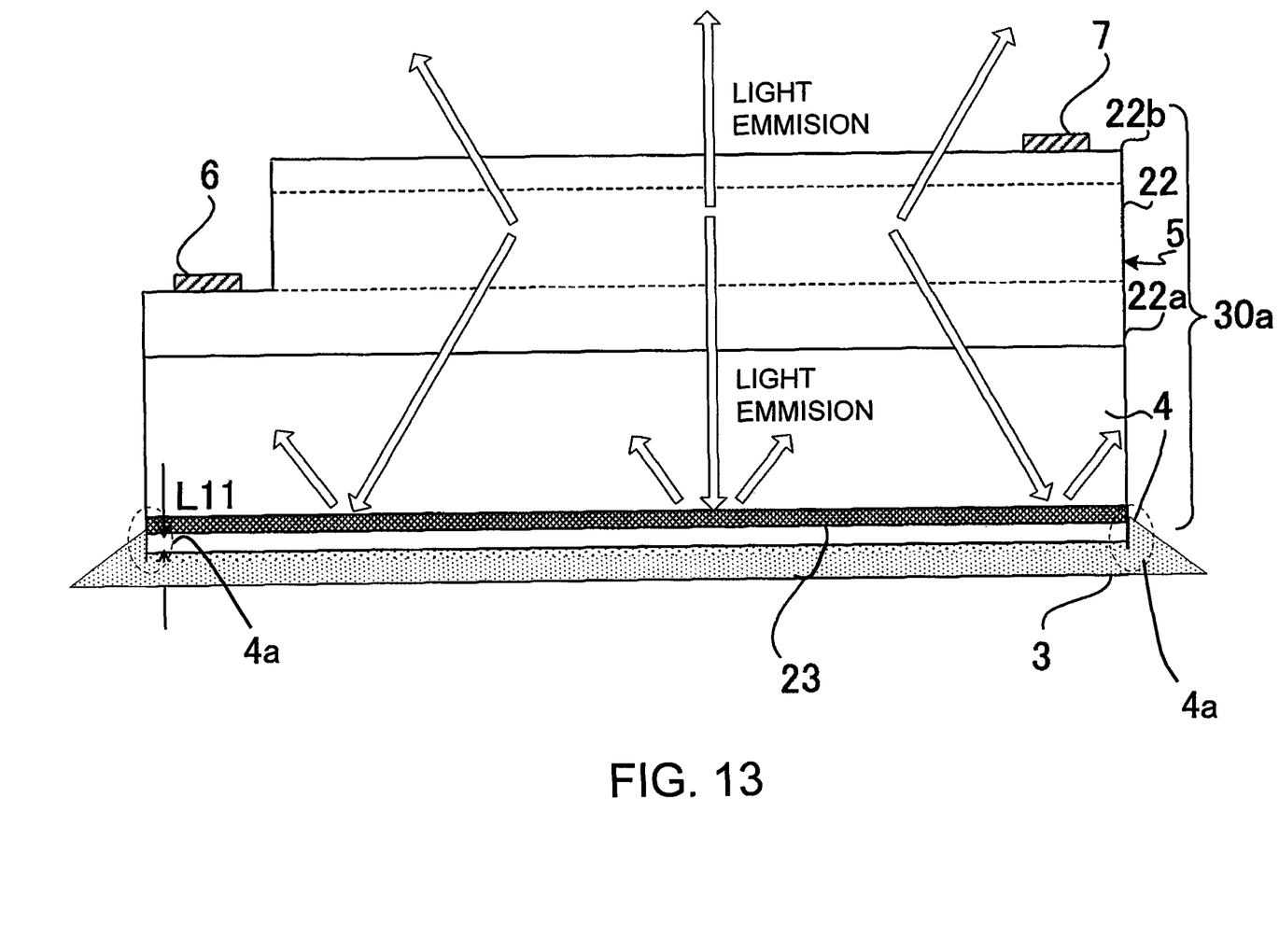
FIG. 13 is a schematic cross-sectional view illustrating a case where a mounting material is formed so as to creep up along a side surface of a sapphire substrate in the second embodiment.

FIG. 13 shows a case where a mounting material 3 is formed so as to creep up along a side surface of a substrate 4 of sapphire in the second embodiment.

In a case where the height of a portion 4a of the mounting material 3 that creeps up exceeds several µm, the upper portion of the reformed layer of aluminum oxide ($Al_xO_y$) that is the light shielding layer 23 obtained by reforming a portion of the sapphire substrate 4 is formed at a position in the substrate 4 so as to be higher than the upper portion of the creeping portion 4a so that deterioration of the creeping portion 4a of the mounting material 3 is effectively prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, a combination of the light shielding layer 21 and the uneven portion 24 may be used.

In each of the embodiments, the chip of the semiconductor light emitting element is fixed onto the lead, as the base, using the mounting material such as the epoxy-based resin. The chip of the semiconductor light emitting element may be fixed onto a ceramic or metal substrate, as the base, using a mounting material. In the case, the mounting material can be effectively prevented from being deteriorated by light incidence.

The conductive types of the epitaxial layers 22a, 22, and 22b may be opposite to the conductive types used in the embodiments. In this case, the anode and cathode electrodes used in the embodiments become the cathode and cathode electrodes, respectively.

The semiconductor light emitting devices according to the embodiments can be used for an indoor or outdoor indication light, an indoor or outdoor illumination, a headlight or stop lamp of a vehicle, a road sign, a traffic signal, or a simple illumination.

What is claimed is:

1. A semiconductor light emitting device comprising:
   a lead;
   a mounting material provided on the lead;
   a semiconductor light emitting element fixed onto the lead via the mounting material; and
   a fluorescent material disposed on the semiconductor light emitting element such that the semiconductor light emitting element is between the fluorescent material and the mounting material,
   the semiconductor light emitting element including:
      a sapphire substrate;
      a light emitting layer provided on a first side of the sapphire substrate;
      an anode electrode and a cathode electrode for supplying an electric power to the light emitting layer; and
      a layer of noncrystalline aluminum oxide provided on a second side of the sapphire substrate opposing the first side such that the layer of noncrystalline aluminum oxide is between the mounting material and the sapphire substrate.

2. The semiconductor light emitting device according to claim 1, wherein the mounting material is an epoxy resin.

3. The semiconductor light emitting device according to claim 1, wherein the layer of noncrystalline aluminum oxide is a reformation layer formed from sapphire.

4. The semiconductor light emitting device according to claim 3, wherein the mounting material is an epoxy resin.

5. The semiconductor light emitting device according to claim 3, wherein the reformation layer is formed by irradiating the sapphire substrate with a laser light.

6. The semiconductor light emitting device according to claim 3, wherein a portion of the mounting material is on a side surface of the sapphire substrate, the side surface intersecting a surface of the sapphire substrate that is on the first side of the sapphire substrate, and at least a portion of the reformation layer is at a position within the sapphire substrate that is higher than the portion of the mounting material that is on the side surface of the sapphire substrate.

7. The semiconductor light emitting device according to claim 1, wherein the layer of noncrystalline aluminum oxide is a continuous layer between the mounting material from the sapphire substrate.

8. The semiconductor light emitting device according to claim 1, wherein the layer of noncrystalline aluminum oxide is provided on the second side of the sapphire substrate so as to completely cover the second side of the sapphire substrate.

9. A semiconductor light emitting device comprising:
   a lead;
   a mounting material provided on the lead;
   a semiconductor light emitting element fixed onto the lead via the mounting material; and
   a fluorescent material disposed on the semiconductor light emitting element such that the semiconductor light emitting element is between the fluorescent material and the mounting material,
   the semiconductor light emitting element including:
      a sapphire substrate;
      a light emitting layer provided on a first side of the sapphire substrate;
      an anode electrode and a cathode electrode for supplying an electric power to the light emitting layer; and
      a layer of noncrystalline aluminum oxide provided within the sapphire substrate such that the layer of noncrystalline aluminum oxide is spaced from a surface of the sapphire substrate that is contacting the mounting material.

10. The semiconductor light emitting device according to claim 9, wherein the mounting material is an epoxy resin.

11. The semiconductor light emitting device according to claim 9, wherein the layer of noncrystalline aluminum oxide is a reformation layer formed from sapphire.

12. The semiconductor light emitting device according to claim 11, wherein the reformation layer is formed by irradiating the sapphire substrate with a laser light.

13. The semiconductor light emitting device according to claim 11, wherein a portion of the mounting material is on a side surface of the sapphire substrate, the side surface intersecting a surface of the sapphire substrate that is on the first side of the sapphire substrate, and at least a portion of the reformation layer is at a position, in the semiconductor light emitting element, that is higher than the portion of the mounting material that is on the side surface of the sapphire substrate.

14. The semiconductor light emitting device according to claim 9, wherein the layer of noncrystalline aluminum oxide is a continuous layer within the sapphire substrate.

15. The semiconductor light emitting device according to claim 14, wherein the layer of noncrystalline aluminum oxide is parallel to the surface of the sapphire substrate that is contacting the mounting material.

16. The semiconductor light emitting device according to claim 9, wherein the layer of noncrystalline aluminum oxide is parallel to the surface of the sapphire substrate that is contacting the mounting material.

* * * * *